United States Patent
Chaudhry et al.

(10) Patent No.: US 7,259,048 B2
(45) Date of Patent: Aug. 21, 2007

(54) VERTICAL REPLACEMENT-GATE SILICON-ON-INSULATOR TRANSISTOR

(75) Inventors: Samir Chaudhry, Orlando, FL (US); Paul Arthur Layman, Orlando, FL (US); John Russell McMacken, Orlando, FL (US); J. Ross Thomson, Clermont, FL (US); Jack Qingsheng Zhao, Orefield, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 11/419,356

(22) Filed: May 19, 2006

(65) Prior Publication Data

US 2007/0111414 A1 May 17, 2007

Related U.S. Application Data

(62) Division of application No. 10/773,900, filed on Feb. 6, 2004, now Pat. No. 7,078,280, which is a division of application No. 09/968,234, filed on Sep. 28, 2001, now Pat. No. 6,709,904.

(51) Int. Cl.
*H01L 21/00* (2006.01)
*H01L 21/84* (2006.01)

(52) U.S. Cl. ............... 438/156; 438/173; 438/192; 257/E21.375

(58) Field of Classification Search ............... 438/156, 438/173, 192; 257/E21.375
See application file for complete search history.

(56) References Cited

U.S. PATENT DOCUMENTS 6,027,975 A * 2/2000 Hergenrother et al. ...... 438/268

* cited by examiner

*Primary Examiner*—Phat X. Cao

(57) ABSTRACT

An architecture for creating a vertical silicon-on-insulator MOSFET. Generally, an integrated circuit structure includes a semiconductor area with a major surface formed along a plane and a first source/drain contact region formed in the surface. A relatively thin single crystalline layer is oriented vertically above the major surface and comprises a first source/drain doped region over which is located a doped channel region, over which is located a second source/drain region. An insulating layer is disposed adjacent said first and said second source/drain regions and said channel region, serving as the insulating material of the SOI device. In another embodiment, insulating material is adjacent only said first and said second source/drain regions. A conductive region is adjacent the channel region for connecting the back side of the channel region to ground, for example, to prevent the channel region from floating.

In an associated method of manufacturing the semiconductor device, a first source/drain region is formed in a relatively thin vertical layer of single crystalline material. A MOSFET gate region, including a channel and a gate electrode, is formed over the first source/drain region. A second source/drain region is then formed over the channel, the regions being appropriately doped to effect MOSFET action.

5 Claims, 13 Drawing Sheets

VERTICAL REPLACEMENT-GATE SILICON-ON-INSULATOR TRANSISTOR

This patent application is a divisional of U.S. application Ser. No. 10/773,900 filed on Feb. 6, 2004, now U.S. Pat. No. 7,078,280, which is a divisional of U.S. application Ser. No. 09/968,234 filed on Sep. 28, 2001, now U.S. Pat. No. 6,709,904.

FIELD OF THE INVENTION

The present invention is directed to semiconductor devices incorporating junctions of varying conductivity types and methods of making such devices. More specifically, the present invention is directed to silicon-on-insulator vertical field-effect transistor devices and methods for fabricating integrated circuits incorporating such devices.

BACKGROUND OF THE INVENTION

Enhancing semiconductor device performance and increasing device density (the number of devices per unit area) continue to be important objectives of the semiconductor industry. Conventionally, device density is increased by making individual devices smaller and increasing the packing density of the devices, but as feature sizes and design rules decrease, the methods for forming devices and their constituent elements must be adapted. For instance, production device sizes are currently in the range of 0.25 microns to 0.12 micron, with an inexorable trend toward even smaller dimensions. However, as the device dimensions shrink, certain manufacturing limitations arise, especially with respect to the lithographic processes.

Currently most metal-oxide-semiconductor field effect transistors (MOSFETs) are formed in a lateral configuration, with the current flowing parallel to the major plane of the substrate or body surface. As the size of these MOSFET devices decreases to achieve increased device density, the fabrication process becomes increasingly difficult. In particular, the lithographic process for creating the gate region channel is problematic, as the device dimensions approach the wavelength of the radiation used in the lithographic process. For lateral MOSFETs, reductions in the gate length are approaching the point where this dimension cannot be precisely controlled through lithographic techniques. As an alternative, expensive x-ray and electron beam lithographic equipment are being considered for the formation of both MOSFETs and JFETs with state-of-the-art channel lengths.

Generally, integrated circuits comprise a plurality of active devices, including MOSFETs, JFETs and bipolar junction transistors, as well as passive components such as resistors and capacitors. Commonly owned U.S. Pat. Nos. 6,027,975 and 6,197,441, which are hereby incorporated by reference, teach certain techniques for the fabrication of vertical replacement gate (VRG) MOSFETs.

Contemporary silicon-on insulator (SOI) processes allow device fabrication on a very thin layer of single crystal silicon on an insulating substrate, rather than on a semiconductor substrate as in conventional integrated circuits. In addition to using silicon dioxide as the insulating layer, two other insulator substances that have the appropriate thermal expansion match to silicon are sapphire and spinel. To form the SOI device, an epitaxial film is grown on the silicon dioxide, or the epitaxial film is deposited on the sapphire or spinel insulating substrate by chemical vapor deposition. In both cases, the resulting typical film thickness is about one micron. The film is patterned and etched using conventional photolithographic techniques to create the islands for each transistor, and the islands are isolated by an insulating trench or by the local oxidation of silicon. Each island may then be processed to form n and p-type source, drain and channel regions by conventional masking and dopant implantation steps.

There are a variety of other techniques for growing single crystal silicon on a silicon dioxide surface. For example, the silicon dioxide layer can be formed beneath the surface of a silicon wafer by high-dose oxygen implantation. The thin silicon layer remaining on the surface above the implanted silicon dioxide is usually about 0.1 µm thick, and can be used as the thin film for device fabrication. This process is referred to as separation by implantation of oxygen (SIMOX). If needed, a thicker silicon film can be grown epitaxially on the SIMOX wafer, using the thin silicon crystalline layer as a seed for the epitaxial layer.

Devices fabricated with SOI technology have several advantages over conventional MOSFET devices. Since the silicon film is thin, the doped regions extend through the film to the insulating substrate (e.g., the sapphire, spinel or silicon dioxide), thereby reducing the junction capacitance to a very small value associated only with the sidewalls between the source/drain/channel regions. Also, since the metal interconnections between transistors pass over the insulating substrate, i.e., in regions where there is no epitaxial silicon, the typical interconnect-substrate capacitance is eliminated, as well as the parasitically induced channels between transistor devices. These capacitance reductions improve the high-frequency performance of the SOI devices over conventional devices formed in a silicon substrate. Also, when implemented in CMOS technology, the SOI structure eliminates the induced latch-up problems because there is no p-n-p-n thyristor between the power supply and ground. The leakage of current from the active regions to the substrate is also significantly reduced in SOI devices because the substrate is an insulator. Further advantages of the SOI technology include resistance to short-channel effects, steeper subthreshold slopes, increased current drive and generally similar processing steps.

MOSFETs fabricated with SOI technology include non-fully depleted MOSFETs where the width of the silicon film is greater than the maximum channel depletion width and fully-depleted MOSFETs having a silicon film thickness that is less than the maximum channel region width. Unlike bulk silicon MOSFETs, the substrate of the prior art SOI MOSFET is usually electrically floating. Therefore, in a non-fully depleted MOSFET, carriers (holes in an NMOS device and electrons in a PMOS device) generated by impact ionization accumulate near the source/body junction of the MOSFET. Eventually sufficient carriers will accumulate to forward bias the body with respect to the source, thus lowering the threshold voltage due to the body-bias effect. Extra current will start flowing, resulting in a "kink" in the current/voltage characteristics. This reduces the achievable gain and dynamic swing for SOI devices fabricated for analog circuits and gives rise to an abnormality in the device transfer characteristics for digital circuit SOI MOSFETs.

In a fully-depleted SOI MOSFET, the channel is completely depleted under normal operating conditions. The source-channel junction has a lower potential barrier to the carriers generated by impact ionization and thus there is a reduced effect on the body and channel potential, and the "kink" is reduced. However, the resulting output resistance is poor, thus making SOI technology less attractive than conventional bulk technology for analog circuitry. Further, in a fully-depleted MOSFET, the depletion charge is reduced for a given body doping concentration, leading to a smaller threshold voltage. But the threshold voltage is sensitive to variations in the silicon film thickness, which makes the fabrication of high performance circuits difficult. Also, the thin silicon film thickness causes high source/drain series resistances, lowering device operational speed. These conditions are substantially due to the lack of a grounded body substrate.

BRIEF SUMMARY OF THE INVENTION

To provide further advances in the fabrication of MOSFETs, an architecture and a fabrication process is provided for a vertical SOI MOSFET device.

According to one embodiment of the invention, a semiconductor device includes a substrate with a first layer of semiconductor material and at least three insulator layers formed thereover. A window or trench formed in the three layers comprises a relatively thin polycrystalline silicon layer around the inner wall surface thereof and an insulator material in the remaining window volume. The source, drain and channel regions are formed in the polycrystalline silicon layer. In a preferred embodiment, the first and the third insulating layers serve as dopant sources to form the source and drain regions and the second insulator layer is a sacrificial layer that is removed and replaced with gate oxide and a gate. In another embodiment, insulator material is absent from the back side of the polycrystalline silicon layer where the channel region is formed, but is present on the backside of the source and drain regions. Thus the backside of the polycrystalline silicon layer in the region of the channel can be contacted and thus grounded, similar to the grounding of the substrate in a conventional lateral MOSFET.

In an associated method of manufacture, an integrated circuit structure is fabricated by providing multiple parallel semiconductor layers in which a window is formed. According to one embodiment, a relatively thin polycrystalline silicon layer is formed around the interior circumference of the window and the source, drain and channel regions are formed therein. The remainder of the window is filled with an insulator material. Certain of the multiple parallel semiconductor layers serve as dopant sources as the source, drain and channel regions are formed by solid phase diffusion of the dopant therefrom. In fabricating the vertical SOI MOSFET, the gate length is precisely controlled through the removal of a sacrificial layer among the multiple parallel layers.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale, but are drawn to emphasize specific features relevant to the invention. Reference characters denote like elements throughout the figures and text.

DETAILED DESCRIPTION OF THE INVENTION

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated. The term "vertical transistor" means a transistor with individual semiconductor components vertically oriented with respect to the major surface so that the current flows vertically between the regions. By way of example, for a vertical MOSFET the source, channel and drain regions are formed in relatively vertical alignment with respect to the major surface.

FIGS. 1 through 17 illustrate cross-sectional views of an integrated circuit structure 200 during various stages of fabrication to form an exemplary device according to the present invention. From the description, it will become apparent how a silicon-on-insulator vertical replacement gate metal-oxide-semiconductor field-effect transistor can be fabricated.

The fabrication process for forming a VRG SOI MOSFET is illustrated with reference to FIGS. 1 through 17. In another embodiment of the present invention, as described in conjunction with FIGS. 18 through 27, two complimentary MOSFETs (CMOS) can be formed in the substrate through an SOI process. According to the embodiment of FIGS. 1 through 17, two parallel SOI MOSFETs are formed, thereby doubling the current capacity over a single SOI MOSFET.

The various semiconductor features and regions described herein are preferably composed of silicon, but it is known to those skilled in the art that other embodiments of the invention may be based on other semiconductor materials, including compound or heterojunction semiconductors alone or in combination.

Figure 1:
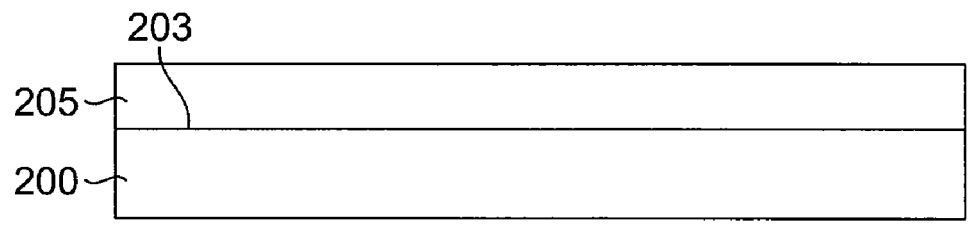
FIGS. 1 through 18 illustrate, in cross-section, a circuit structure according to a first embodiment of the invention during sequential fabrication steps.

Referring to FIG. 1, a heavily doped drain contact 205 is formed in a silicon substrate 200, preferably a substrate having a <100> crystal orientation along an exposed major surface 203. In this illustration of a vertical MOSFET, the drain contact of the device is formed in the silicon substrate (by dopant implantation, for example) and the source region is formed atop a subsequently formed vertical channel, as will be discussed further. Alternatively, the source contact can be formed in the substrate with the drain contact formed atop the vertical channel. The former embodiment is the subject of this description. However, from this description, one skilled in the art can easily form a device in which the source contact is formed in the silicon substrate and the drain contact is formed overlying the subsequently formed vertical channel. Conventional isolation techniques are employed to isolate device regions within the silicon substrate 200 as required.

The depth of the heavily doped drain contact 205, and the dopant type (e.g., n-type or p-type) and concentration are matters of design choice. An exemplary drain contact 205, wherein the dopant is phosphorous (P), arsenic (As), antimony (Sb) or boron (B) has a dopant concentration in the range of about $1\times10^{19}$ atoms/cm$^3$ to about $5\times10^{20}$ atoms/cm$^3$. A drain contact depth of about 200 nm is suitable. Preferably, the drain contact 205 is formed by a high dose ion implantation in the range of $1\times10^{14}$ to $1\times10^{16}$ atoms/cm$^2$ with an implant energy of 1 to 100 KeV. In one embodiment the silicon substrate 200 is p-type epitaxially grown doped silicon, grown from the major surface 203. The drain contact 205 is therefore an n+region.

Figure 2:
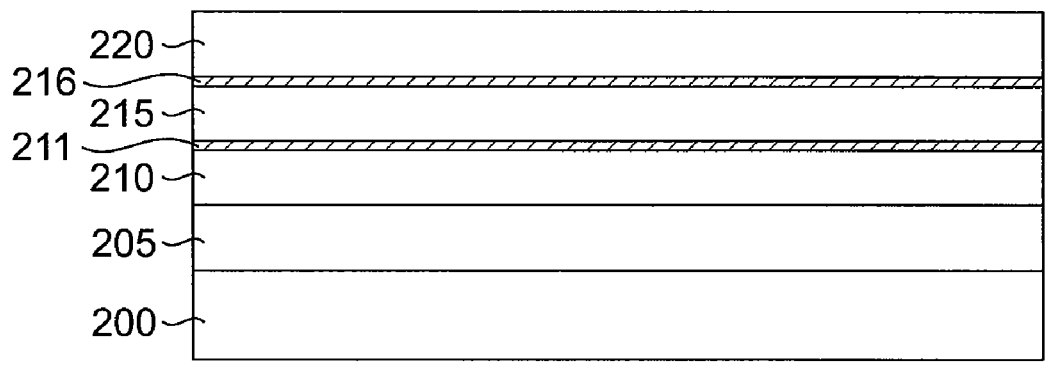

In FIG. 2, multiple material layers are formed over the drain contact 205. In a preferred embodiment, five layers of material 210, 211, 215, 216 and 220 are so formed. The insulating layer 210 insulates the drain contact 205 from what will eventually be the overlying gate. Thus, the insulating layer 210 is composed of a material and has a thickness that is consistent with this insulating objective. Examples of suitable materials include doped silicon dioxide. The use of doped insulating layer is preferable because in certain embodiments the insulating layer 210 serves as a dopant source, as will be explained further hereinbelow, to form source/drain regions in the vertical device. Examples of silicon dioxide dopant sources are PSG (phospho-silicate glass, i.e., a phosphorous-doped silicon dioxide) and BSG (boro-silicate glass, i.e., a boron-doped silicon dioxide). One skilled in the art is aware of suitable expedients for forming a layer of PSG or BSG on a substrate, e.g., plasma-enhanced chemical vapor deposition (PECVD). Suitable thicknesses for the insulating layer 210 are in the range of about 25 nm to about 250 nm. When serving as a dopant source, the insulating layer 210 contains a high concentration of dopant on the order of $1 \times 10^{21}/cm^3$.

The layer 211 is an etch stop layer, which, as is known to those skilled in the art, is designed to prevent an etchant from proceeding to an underlying or overlaying layer. The etch stop therefore, has a significantly greater etch resistance to a selected etchant than the adjacent layer or layers that are to be removed by the etchant. Specifically in this case, for the selected etchant, the etch rate of the etch stop layer 211 is much slower than the etch rate of the overlying layer, which, as will be discussed below, is a sacrificial layer to be removed by the etch process. According to a preferable embodiment of the present invention, the sacrificial layer is formed of silicon dioxide (which in one embodiment is formed from tetraethylene ortho silicate (TEOS)), and thus an appropriate etch stop material for the layer 211 limits action of the etchant on the underlying insulating layer 210.

For the etch stop layer 211 formed over the insulating layer 210, silicon nitride ($Si_3N_4$) is a suitable etch stop material. The thickness of the etch stop layer 211 is dependent upon the resistance of the etch stop material to the selected etchant, relative to the material thickness to be removed through the etch process. In a preferable embodiment, in addition to serving as an etch stop layer, the etch stop layer 211 serves as a diffusion barrier to dopants diffused from the insulating layer 210 to create the source/drain regions. The diffusion barrier thereby defines the spacing and length of the source/drain regions relative to the gate, as will be further discussed below. The etch stop layer 211 has a thickness ranging between about 5 nm and about 50 nm.

A sacrificial layer 215 is formed (for example by a TEOS deposition process) over the etch stop layer 211. In subsequent processing, the sacrificial layer 215 will be removed and the gate of the device formed in the space vacated by the sacrificial layer 215. Thus, the material of the sacrificial layer 215 is chosen such that the etchant has a significantly higher selectivity for removing the sacrificial layer 215 relative to the etch stop layer 211. The thickness of the sacrificial layer 215 is selected to correspond to the channel length of the final device. Thus the channel is controlled by a layer deposition process, rather than by the prior art lithographic process. Undoped silicon dioxide is an example of a suitable material for the sacrificial layer 215.

Preferably, the sacrificial layer 215 is deposited by decomposition of a tetraethyl orthosilicate precursor, or TEOS, $Si(OC_2H_5)_4$. Decomposition of vaporized liquid TEOS to form a silicon dioxide film (referred to herein as a TEOS-deposited oxide) typically occurs by chemical vapor deposition (CVD) at 650° C. to 750° C. in an oxygen environment. Such TEOS depositions are known to provide good uniformity and step coverage when needed. Generally, the deposited film is understood to be a non-stoichiometric oxide of silicon, although it is often referred to as silicon dioxide. Inclusion of ozone ($O_3$), e.g., up to 10 percent of the reacting oxygen, facilitates lower temperature deposition. A typical reaction, which includes ozone, is performed at 400° C. and 300 Torr with 4 standard liters per minute (slm) oxygen, the oxygen comprising 6 percent ozone, 1.5 slm He and 300 standard cubic centimeters per minute (sccm) TEOS.

An etch stop layer 216 is formed over the sacrificial layer 215. The etch stop layer 216 serves similar functions as the etch stop layer 211 and may, for example, be formed of silicon nitride.

An insulating layer 220 is formed over the etch stop layer 216. Because it is advantageous that the insulating layer 220 have the same etch rate as the insulating layer 210 (for a common etchant), it is preferred that the insulating layers 210 and 220 be formed of the same material, e.g. PSG or BSG, which may also serve as a dopant source for the source/drain regions.

All of the layers 210, 211, 215, 216 and 220 may be deposited using conventional chemical vapor deposition (CVD) process or other well-known deposition techniques. With regard to the aforedescribed sequence of layers, it should be noted that other embodiments may include significant variations, for example, fewer deposited layers. In any case, the resulting structure will be used to form a vertical channel region for the MOSFET device.

Figure 3:
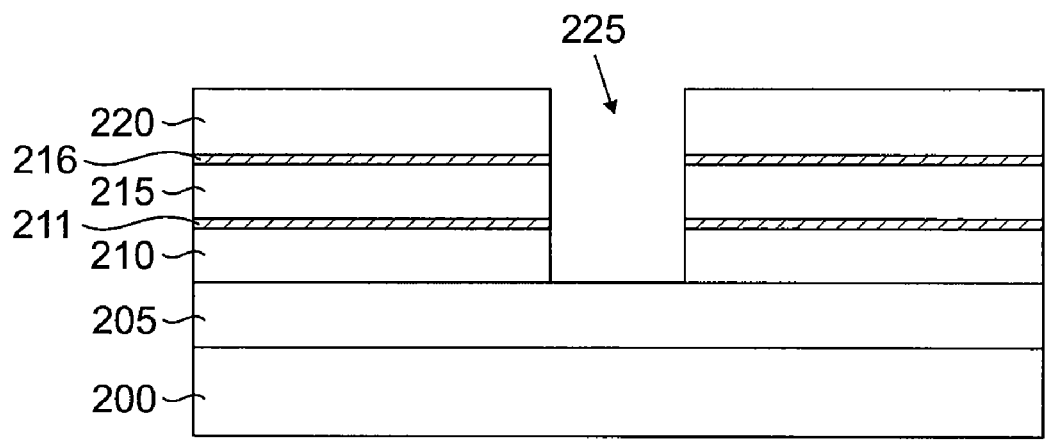

Referring to FIG. 3, an opening or window 225 is anisotropically etched through the insulating layer 210, the etch stop layer 211, the sacrificial layer 215, the etch stop layer 216 and the insulating layer 220, downwardly to the drain contact 205 of the silicon substrate 200. The horizontal window dimension of FIG. 3 is determined by the performance characteristics and size constraints for the device under fabrication, and the limitations of the lithographic process utilized to form the window. The length of the window 225 (also referred to as a trench), where the length is orthogonal to both the horizontal and vertical dimensions in the FIG. 3 cross-section, is largely a matter of design choice. For a given horizontal dimension, the current capacity of the doped region to be formed later in the window 225 increases with increasing window length. The shape of the window is also a matter of design choice; typically the window is circular, elliptical or rectangular when viewed from above in FIG. 3.

Figure 4:
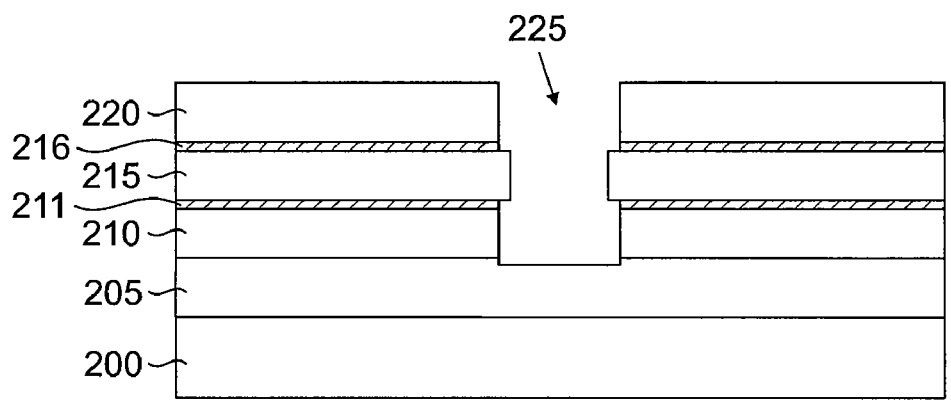

The window 225 is then subjected to a chemical cleaning process, (e.g., RCA or piranha-clean) to clean the silicon at the bottom of the window 225. As a result of this cleaning step, small portions of the insulating layers 210 and 220 forming a boundary with the window 225 are removed. The indentations created are illustrated in FIG. 4. As shown, the sacrificial layer 215 and the etch stop layers 211 and 216 now extend beyond the edge of the insulating layers 210 and 220.

Figure 5:
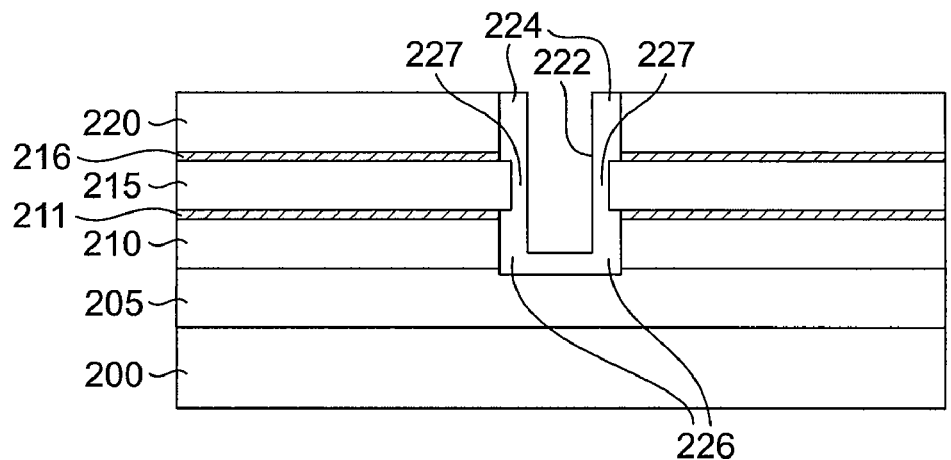

Referring to FIG. 5, a conformal doped polysilicon layer 222 is deposited, for example, by chemical-vapor deposition. The doped polysilicon layer 222 will become a thin single crystalline film of the SOI device in which the various device regions are formed, as will be discussed further. The polysilicon layer 222 is therefore doped with the opposite dopant type than the drain contact 205. In-situ doping of the polysilicon layer 222 during formation is preferable. In situ dopant introduction, i.e., as a layer of material is formed via chemical vapor deposition, is well known and not described herein. Note, the dopants are introduced into the atmosphere at the appropriate point in the deposition process to produce the desired concentration as a function of layer depth. Exemplary polysilicon doping levels are $1 \times 10^{16}$ to $1 \times 10^{19}$ dopant atoms/cm$^3$.

The polysilicon layer 222 is then recrystallized by first melting the polysilicon, with for example, a laser anneal and then allowing it to reform as a single-crystal structure, using the drain contact 205 as the seed layer. The recrystallized polysilicon layer 222 provides a single-crystal high-quality region for the SOI device.

During the laser anneal process, the dopants from the doped insulating layers 210 and 220 are driven into the polysilicon layer 222 by solid phase diffusion to form the source regions 224 and the drain regions 226 of the SOI MOSFET devices. These diffusions counterdope the polysilicon layer 222 with the opposite dopant type than the channel dopant, applied in situ when the polysilicon layer was formed as discussed above.

The channels are referred to by reference character 227 in FIG. 5. In solid phase diffusion, as utilized at this point in the fabrication process, an oxide (e.g., silicon oxide) serves as the dopant source. At elevated temperatures, the dopant is driven from the doped oxide to the adjacent undoped (or lightly doped) region of the adjacent material. This technique is advantageous because the doped area is defined by the interface between the polysilicon layer 222 and the insulating layers 210 and 220 that serve as the dopant source, thus allowing the formation of self-aligned source/drain regions. The source/drain regions extend from the insulating layers 210 and 220 across the lateral width of the polysilicon layer 222, forming a vertical MOSFET device in the polysilicon layer 222. Examples of solid phase diffusion techniques are described in Ono, M., et al, "*Sub-50 nm Gate Length N-MOSFETS with* 10 *nm Phosphorus Source and Drain Junctions*," IEDM 93, pp. 119-122 (1993) and Saito, M., et al., "*An SPDD D-MOSFET Structure Suitable for* 0.1 *and Sub* 0.1 *Micron Channel Length and Its Electrical Characteristics*," IEDM 92, pp. 897-900 (1992), which are hereby incorporated by reference. The final concentration of the dopant in source/drain regions 224 and 226 is typically about at least $1 \times 10^{19}$/cm$^3$, with dopant concentrations of about $5 \times 10^{19}$/cm$^3$ contemplated as advantageous. As with a conventional MOSFET, the source/drain regions are more heavily doped than the channel region.

Considering that in the exemplary embodiment, the contact 205 is a drain contact, the region 226 represents a drain region of a vertical SOI MOSFET. A channel region 227 overlies the drain region 226 and a source region 224 overlies the channel region 227. If the polycrystalline silicon was formed around the entire inner surface of the window 225, then the resulting SOI MOSFET cross-section is determined by the window cross-section, that is, when viewed from above in FIG. 5. If certain vertical regions of the polycrystalline silicon are insulated from other vertical regions, (and with no interconnecting polycrystalline silicon material on the floor of the window 225) then a single vertical SOI MOSFETs is formed within each vertical region. For example, if polycrystalline silicon is formed over only two vertical walls segments of the window 225, then doped regions for two vertical MOSFETs can be formed within the window 225. The same result can be achieved by first forming polycrystalline silicon over the entire interior surface of the window 225, then forming vertical insulative strips to separate polycrystalline silicon regions. Device regions are then formed within the polycrystalline silicon regions.

Figure 6A:
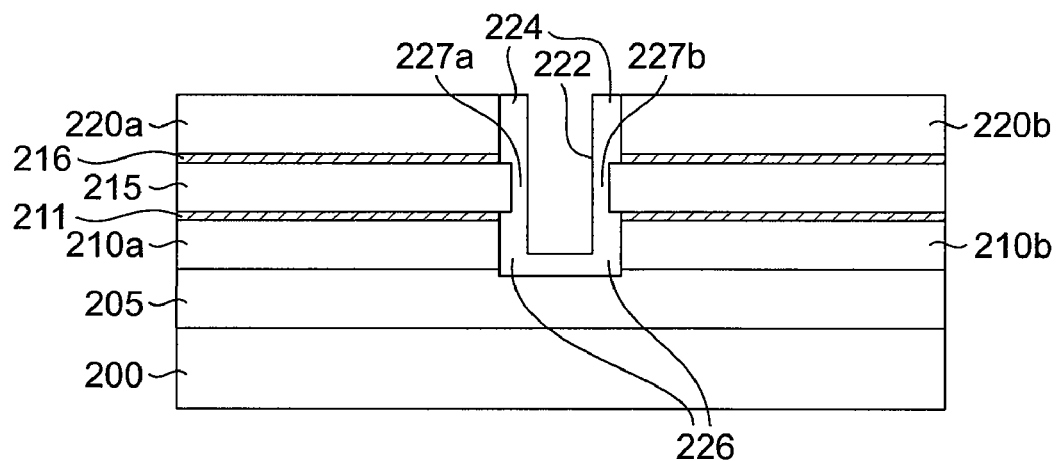
Figure 6B:
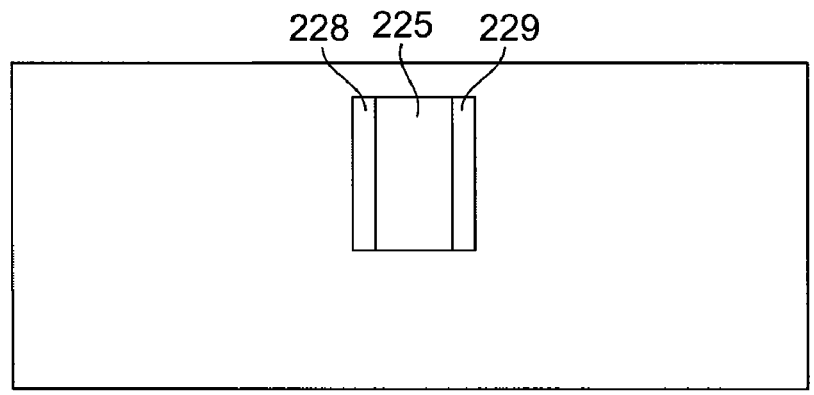

If it is desired to form a CMOS structure in the window 225, i.e., complimentary MOSFETs, a silicon nitride layer is first formed over the polysilicon layer 222 then patterned to open one or more regions for n-type dopants. The polysilicon layer 222 is masked a second time and patterned to open one or more regions for p-type dopants. As shown in FIG. 6A, p-type dopants are present in one channel region 227a along one vertical surface of the device and n-type dopants are present in an opposing channel region 227b. Two such complimentary MOSFETs 228 (p-channel) and 229 (n-channel) are shown in the top view of FIG. 6B. Additionally, for a CMOS device, the insulating layers 210 and 220 are bifurcated during fabrication into insulating layers 210a and 210b and 220a and 220b as shown, so that n-type dopants are diffused from the insulating layer 210a and 220a to create the source and drain regions for the p-channel MOSFET and p-type dopants are diffused from the insulating layers 210b and 220b to create the source and drain regions for the n-channel MOSFET.

In yet another embodiment, a thin layer (e.g., a thickness of about 25 nm) of undoped silicon dioxide is formed over the source contact 205. Referring to FIG. 5, this layer (not shown) acts as a barrier to undesirable solid phase diffusion from the insulating layer 210, (the dopant source), down through the source contact 205 and then up into the polycrystalline layer 222.

After the polycrystalline layer 222 is doped and the channel and source/drain dopants distributed as desired, the integrated circuit structure 200 is preferably not subjected to conditions that may significantly affect the dopant distribution in the polysilicon layer 222. Preferably, but not necessarily, after this step, the integrated circuit structure 200 is not exposed to temperatures that exceed 1100° C. In fact, it is advantageous if the integrated circuit structure 200 is not exposed to temperatures in excess of 1000° C. In certain embodiments, the substrate is not exposed to temperatures that exceed 900° C. for prolonged periods of time (e.g. in excess of several minutes). However, the integrated circuit structure 200 can be subjected to rapid thermal annealing at temperatures of about 1000° C. without adversely affecting the distribution of the dopants. Rather than limiting the high temperature exposure of the substrate 200, in alternative processes subsequent high temperature steps may be designed to produce the desired dopant distributions.

Figure 7:
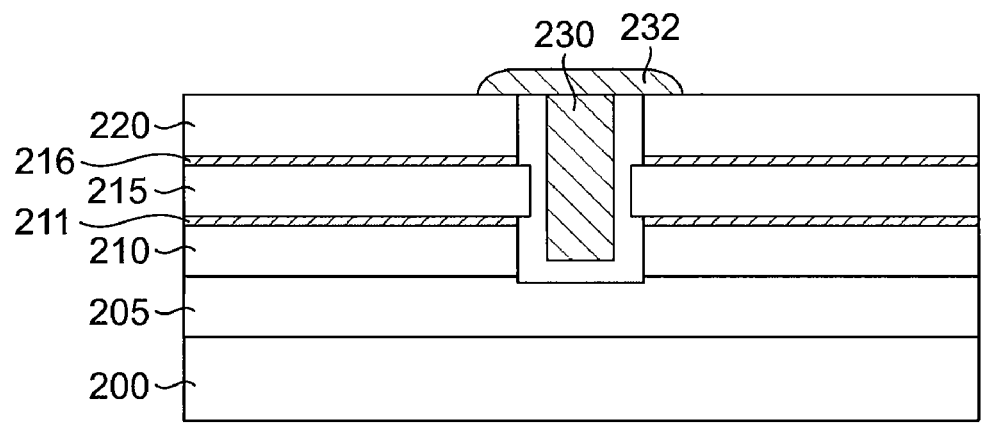
Figure 8:
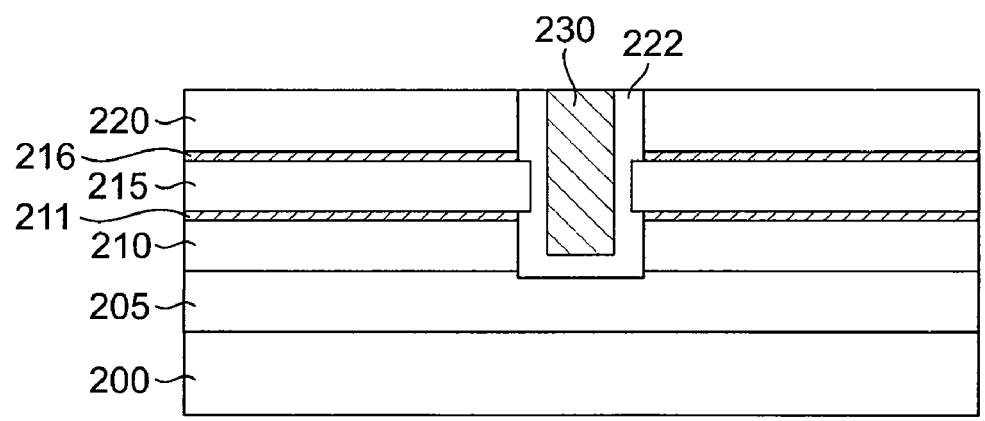

Referring to FIG. 7, silicon dioxide material 230 is deposited in the remaining open volume of the window 225, also forming a top portion 232 thereof. Preferably, the silicon dioxide is formed by chemical vapor deposition. The top portion 232 is removed, for example, by chemical/mechanical polishing. The resulting structure is illustrated in FIG. 8. The silicon dioxide material 230 serves as the insulator layer for the silicon-on-insulator (SOI) devices.

Figure 9:
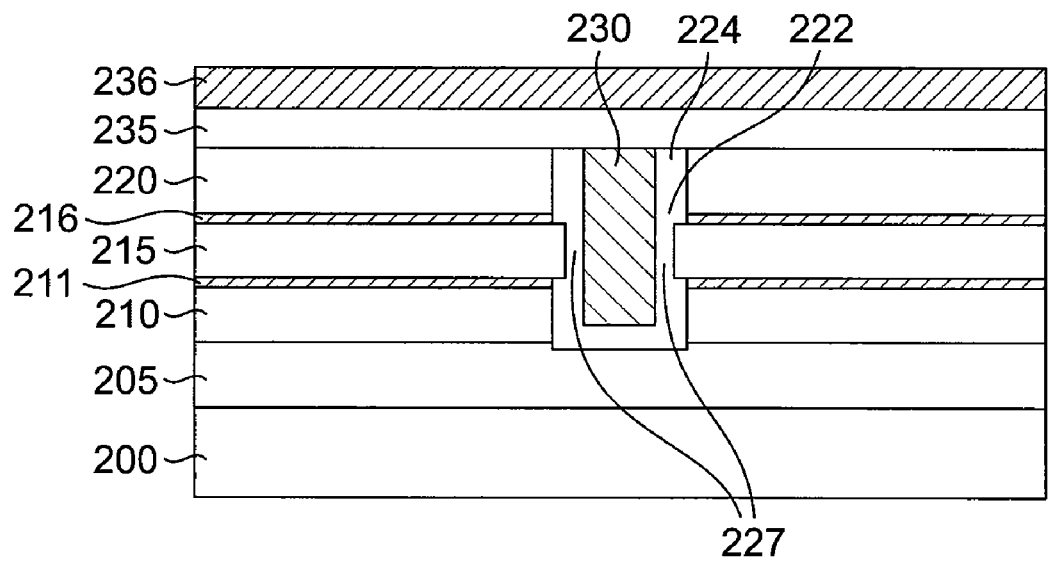

As shown in FIG. 9, a conformal source contact 235 is formed over the insulating layer 220, the polycrystalline layer 222 and the silicon dioxide layer 230. The source contact 235 electrically contacts the source region 224 of each of MOSFET. Since the source regions 224 are highly doped, a low resistivity contact is provided. One example of the suitable material for the source contact 235 is doped polycrystalline silicon. The selected dopant is opposite in type to the dopant of the MOSFET channel 227. The concentration of the dopant in the source contact 235 is greater than about $1 \times 10^{20}$ atoms/cm$^3$.

Figure 10:
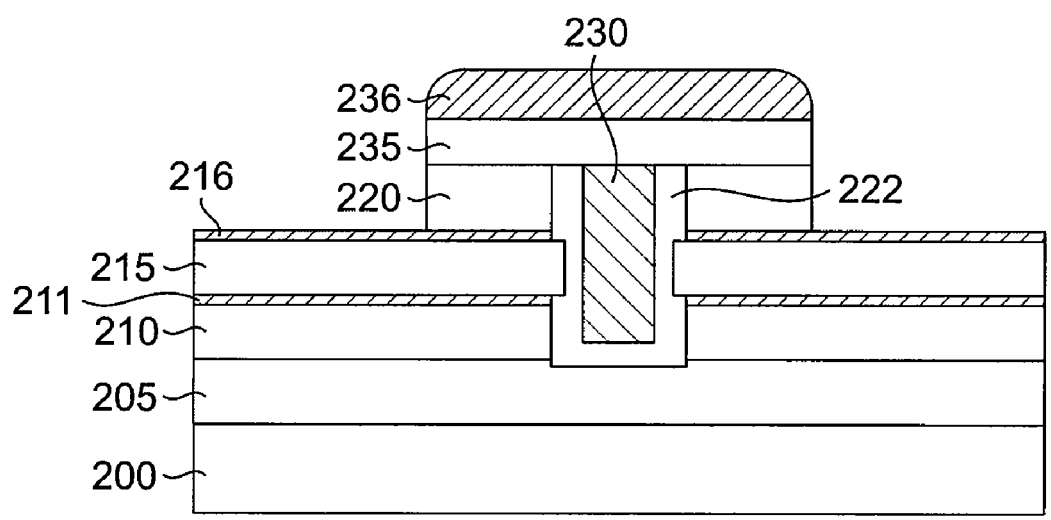

As further illustrated in FIG. 9, a conformal etch stop layer 236 is deposited over the source contact 235. The material selected for the etch stop layer 236 is selected to have an etch rate that is significantly lower than the etch rate of the sacrificial layer 215. Preferably, the material selected for the etch stop layer 236 is the same as the material of the etch stop layers 211 and 216, but preferably is thicker than the etch stop layers 211 and 216. One example of a suitable material is silicon nitride. The etch stop layer 236 is formed over the source contact 235 using known techniques. Using conventional lithographic techniques, the source contact 235, the etch stop layer 236 and the insulating layer 220 are patterned (using one or more dry etch steps) so that the only remaining portions are those either overlying or adjacent the polycrystalline layer 222 and the silicon dioxide layer 230. The final configuration is shown in FIG. 10.

Figure 11:
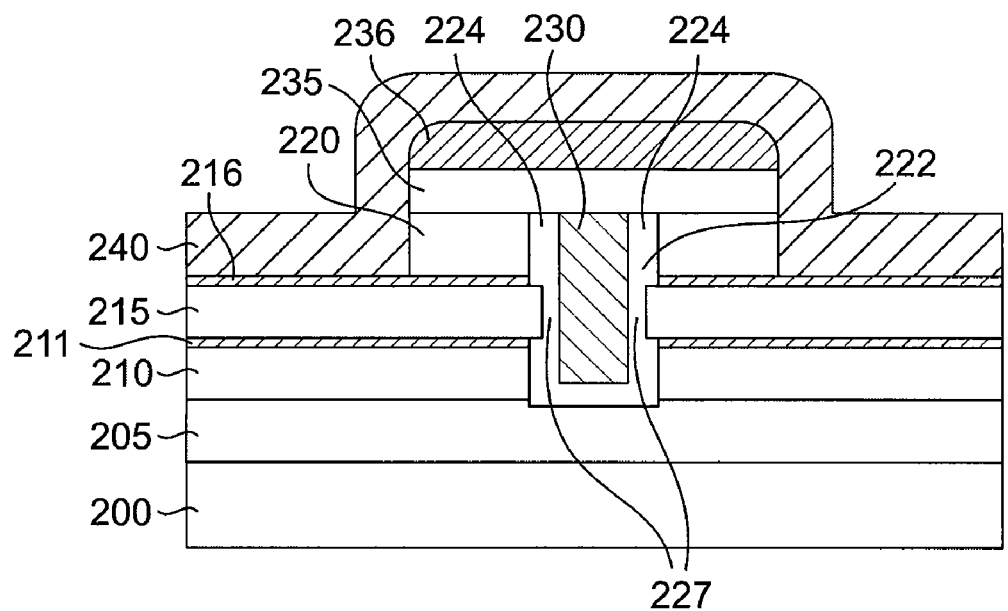

As illustrated in FIG. 11, a conformal etch stop layer 240 is then deposited. For a given etch chemistry, the material of the etch stop layer 240 is selected to have an etch rate that is significantly lower than the etch rate of the sacrificial layer 215. One example of a suitable material for the etch stop layer 240 is silicon nitride. The thickness of the etch stop layer 240 is selected so that the remaining portions of the source contact 235, the etch stop layer 236 and the insulating layer 220 are protected from contact with subsequent etchants.

Figure 12:
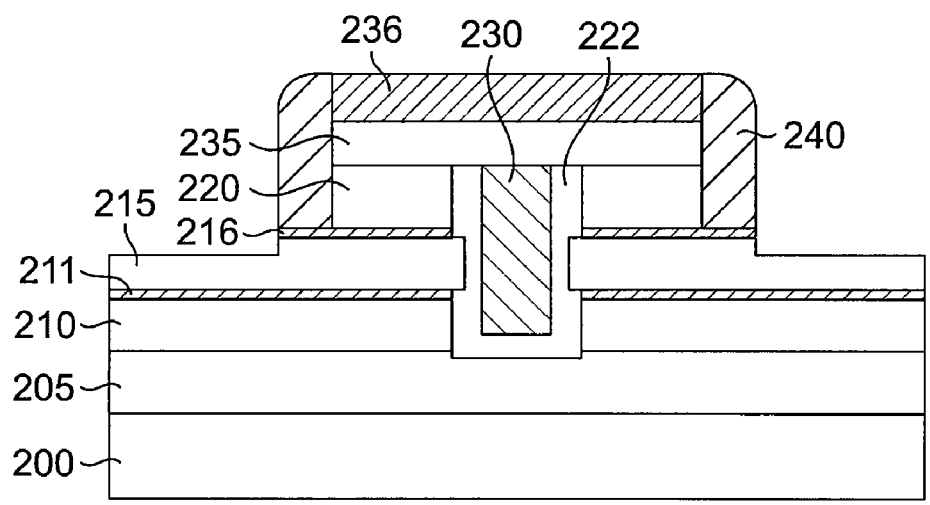

The etch stop layer 240 is then etched using an anisotropic etch such as dry plasma etch, which also removes a portion of the etch stop layer 216. Therefore, as shown in FIG. 12, the only portions of the etch stop layer 240 that remain after the anisotropic etch are the sidewall portions laterally adjacent to the insulating layer 220, the source contact 235 and the etch stop layer 236. As a result of this etch process, the sacrificial layer 215 is also exposed.

Figure 13:
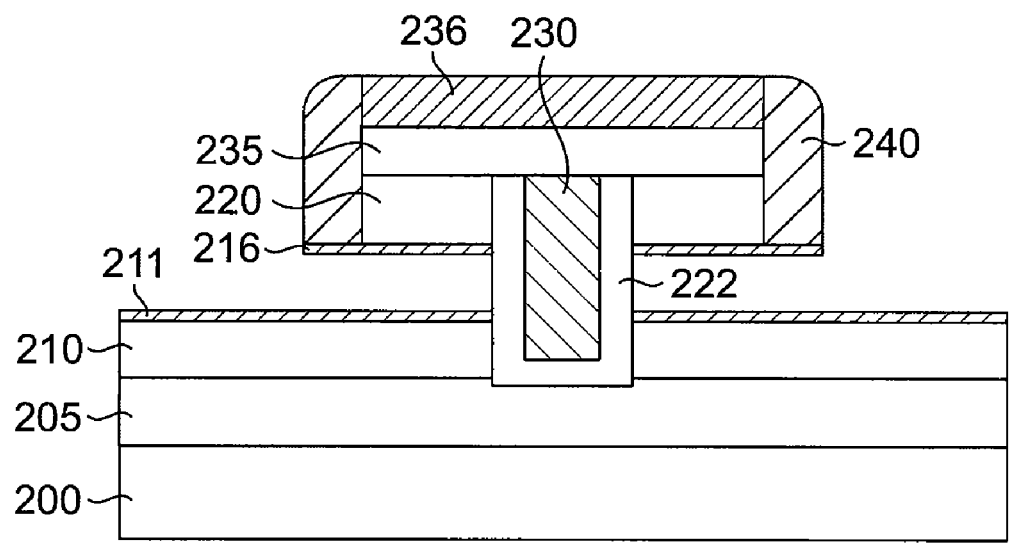

The device is then subjected to a wet etch (e.g., an aqueous hydrofluoric acid) or an isotropic dry etch (e.g., an anhydrous hydrofluoric acid), which removes the exposed remaining portion of the sacrificial layer 215. The result is illustrated in FIG. 13, showing that the insulating layer 210 is still covered by the etch stop layer 211. The insulating layer 220 and the source contact 235 are encapsulated by the remaining segment of the etch stop layer 216 and the etch stop layers 236 and 240, and thereby isolated from contact with subsequent etch expedients. The exposed portion of the polycrystalline layer 222 now defines the physical channel length of the SOI MOSFET devices.

Figure 14:
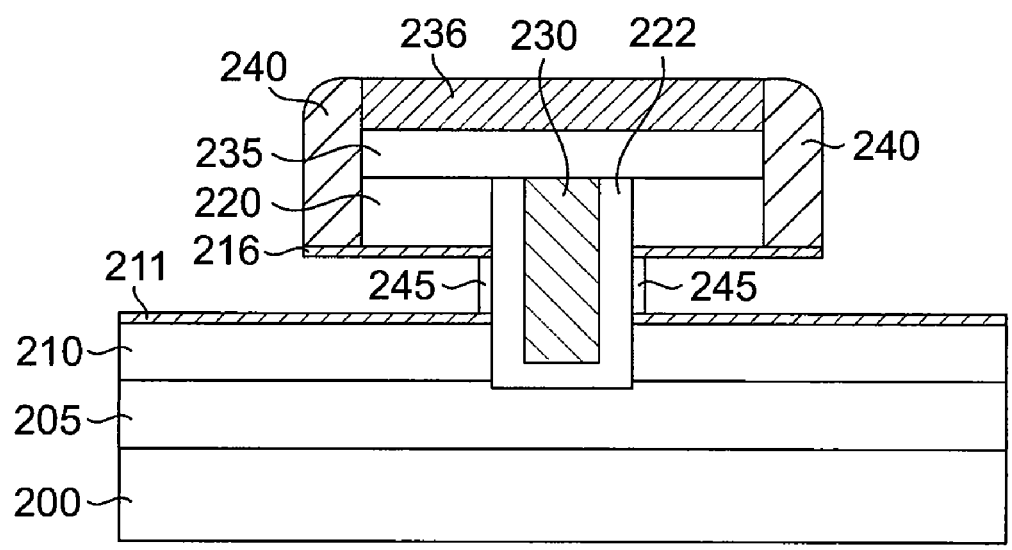
Figure 15:
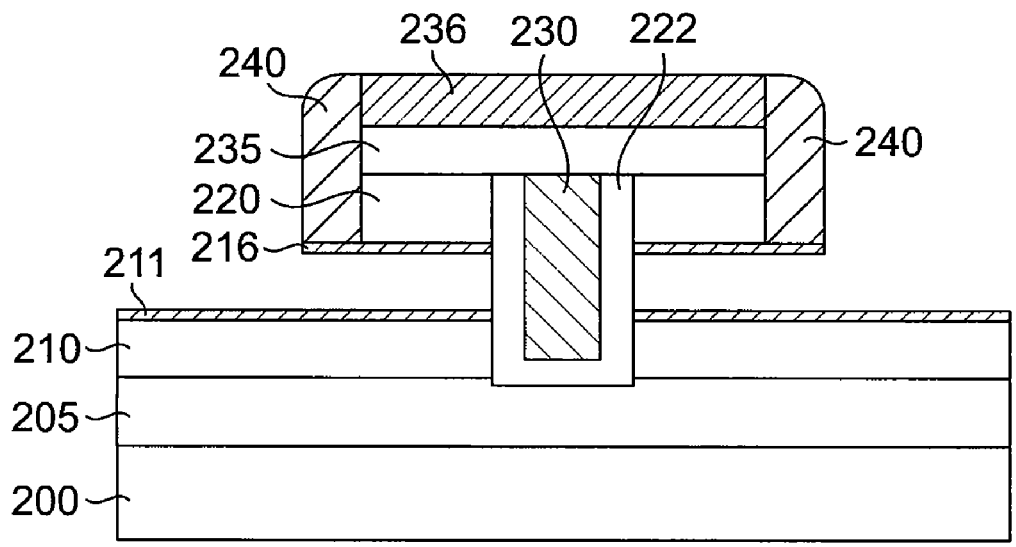
Figure 16:
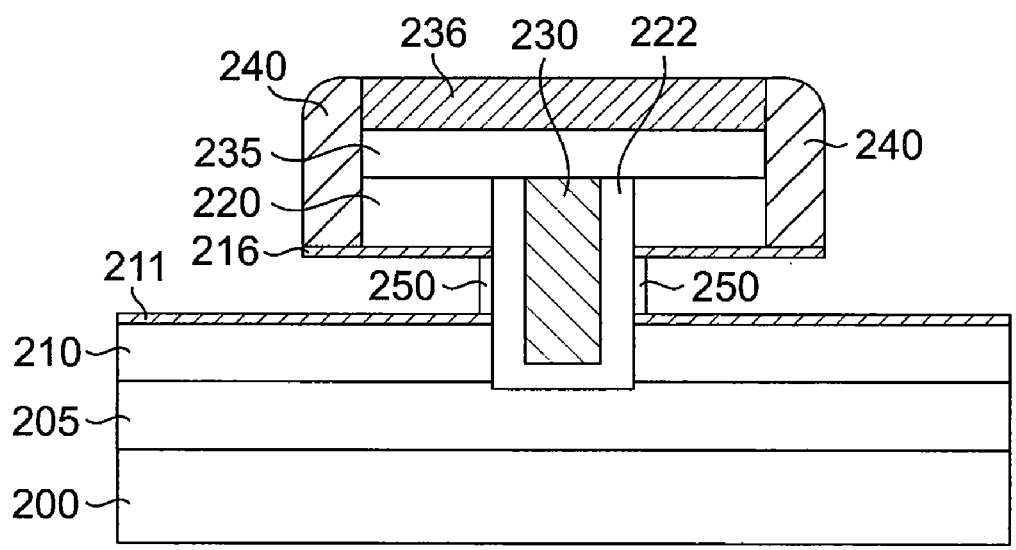

Referring to FIG. 14, a sacrificial layer of thermal silicon dioxide 245 is grown on the exposed surface of the polycrystalline layer 222, to a thickness on the order of less than about 10 nm. The thermal silicon dioxide layer 245 is then removed (see FIG. 15) using a conventional isotropic etch (e.g. an aqueous hydrofluoric acid). As a result of the formation and then the removal of the thermal silicon dioxide 245, the surface of the polycrystalline layer 222 is smoother and some of the sidewall defects are removed. The etch stop layers 211 and 216 prevent the etch expedient used to remove the thermal silicon dioxide layer 245 from contacting the insulating layers 210 and 220 and the source contact 235. This step is not necessarily required in device fabrication, but can be useful for improving the properties of the later formed gate dielectric by, for example, reducing interface traps. The step maybe omitted if the silicon defects are known not to be detrimental to the device under fabrication.

Next, a layer of gate dielectric 250 is formed on the exposed portion of the polycrystalline layer 222. See FIG. 16. Suitable dielectric materials include, for example, thermally-grown silicon dioxide, silicon oxynitride, silicon nitride or metal oxide. The thickness of the gate dielectric 250 is about 1 nm to about 20 nm. One example of a suitable thickness is 6 nm. In one embodiment, the silicon dioxide layer is grown by heating the integrated circuit structure 200 to a temperature in a range of about 700° C. to about 1000° C. in an oxygen-containing atmosphere. Other expedients for forming the gate dielectric 250 may include chemical vapor deposition, jet vapor deposition or atomic layer deposition, all of which are contemplated as suitable and well known.

Figure 17:
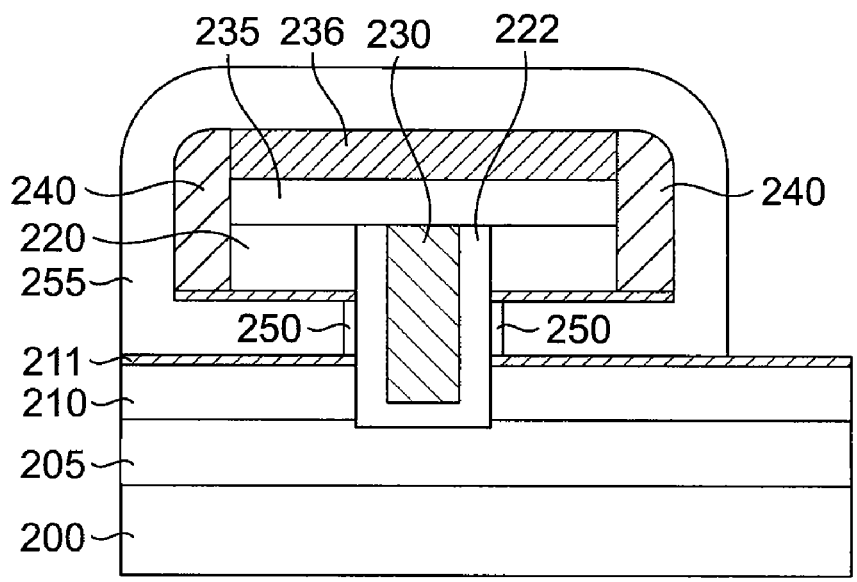

Referring to FIG. 17, in the SOI MOSFET region, a gate electrode is formed surrounding the gate dielectric 250, and thus the channel region, by depositing a layer 255 of sufficiently conformal and suitable gate material. For example, a layer of doped amorphous silicon, in which the dopant is introduced in situ, is deposited and then crystallized to form doped polycrystalline silicon. Other examples of suitable gate electrode materials include silicon-germanium and silicon-germanium-carbon. Metals and metal-containing compounds that have a suitably low resistivity and are compatible with the gate dielectric material and the subsequent semiconductor processing steps, are also contemplated as suitable gate electrode materials. It is advantageous if the gate material has a work function near the middle of the band gap of the semiconductor plug material. Examples of such metals include titanium, titanium nitride, tungsten, tungsten silicide, tantalum, tantalum nitride and molybdenum. Suitable expedients for forming the gate electrode material include chemical vapor deposition, electroplating and combinations thereof. If the two channel regions 227 are doped opposite conductivity type as discussed above, the formation of a common gate electrode for both channels creates a conventional CMOS inverter circuit.

Typically, the drain contact 205 and the source contact 235 are more highly doped than their respective doped regions, so that low resistance contacts are available for the subsequently formed metal interconnect layers. Since, according to the process of the present invention, the source contact 235 (and the drain contact 205) is formed separately from the source region 224 (and the drain region 226), the regions of relatively higher and lower dopant concentrations can be individually controlled to achieve the optimum performance for the doped active region and the contact.

Figure 18:
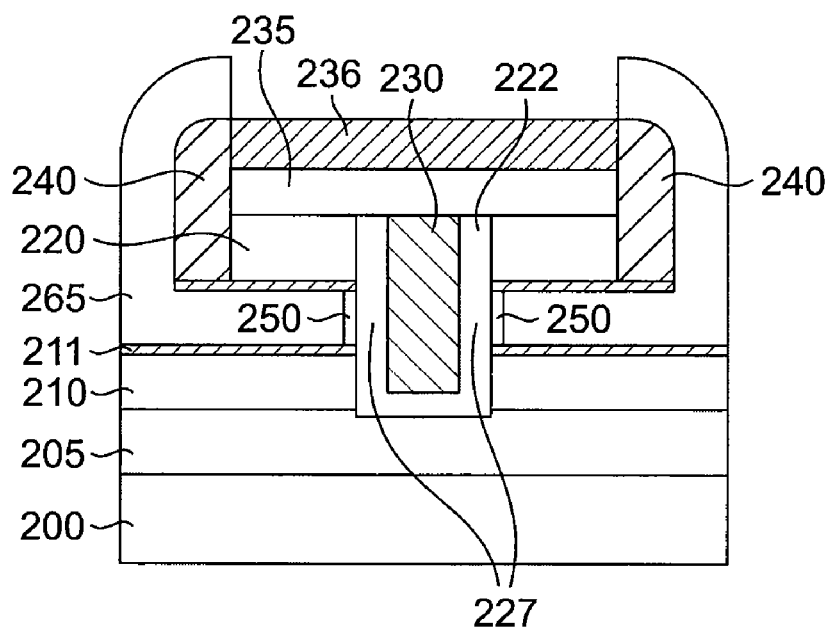

Referring to FIG. 18, the layer 255 is patterned to form the gate 265 of the MOSFET device. The gate configuration is largely a matter of design choice.

An SOI MOSFET fabricated according to the teachings of the present invention provides a uniform depletion layer (or a uniform pinch-off condition) because the gate completely surrounds the channel and the channel is uniformly doped along a horizontal line in FIG. 18 that is perpendicular to the direction of carrier flow (vertical). Note that a prior art MOSFET channel is oriented horizontally and thus the carriers flow horizontally through it. Because the channel is formed by diffusion of dopants into the semiconductor substrate, the upper region of the channel has a higher doping density then the lower region. As a result, the depletion layer is not uniform along any vertical line passing through the channel and perpendicular to the direction of carrier flow.

It is observed in the finished SOI MOSFET device of FIG. 18, that the channel regions 227 are floating, i.e., not grounded. While access to the channel regions 227 in the third dimension (outside the plane of the paper) is possible, this adds complexity and cost to the fabrication process. As is known by those skilled in the art, in a conventional lateral or planar MOSFET, the substrate in which the channel is formed is typically grounded. An ungrounded substrate floats at a voltage dependent upon the charge stored in the substrate, and this potential effects the MOSFET threshold voltage. Further, the existence of a sustained charge in an ungrounded substrate causes degradation of that region over time. It is therefore beneficial and typical to ground the substrate. These same benefits can be enjoyed by a VRG SOI MOSFET of the present invention according to the following fabrication process steps.

Recall that in the previous embodiment a polycrystalline silicon layer 222 is formed within the window 225. Dopants from the insulating regions 210 and 220 are then driven by solid phase diffusion into specific regions of the polycrystalline silicon layer 222 to form source regions 224 and drain regions 226. The polycrystalline silicon was doped upon deposition to form the channel region 227 therein. This essentially represents the status of the fabrication process as of FIG. 6 in the first embodiment of the present invention.

Figure 19:
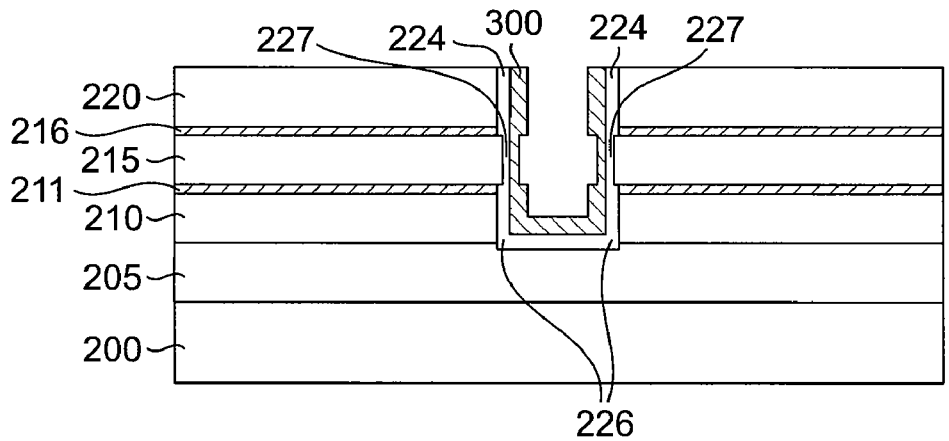
FIGS. 19 through 28 illustrate, in cross section, a circuit structure according to a second embodiment of the invention during sequential fabrication steps.

Turning now to FIG. 19, in a second embodiment, a silicon dioxide layer 300 is grown over the polycrystalline silicon layer 222. As in a conventional lateral MOSFET and the SOI MOSFET embodiment described above, the source regions 224 and the drain regions 226 are more heavily doped than the channel region 227. It is known in the art that the process of growing silicon dioxide adjacent two doped regions, one having a higher doping concentration than the other, will produce a thicker silicon dioxide layer adjacent the higher doped region. Thus, the silicon dioxide layer 300 takes on a shape shown in FIG. 19. It is also known that this phenomenon does not occur if the oxide layer is deposited.

Figure 20:
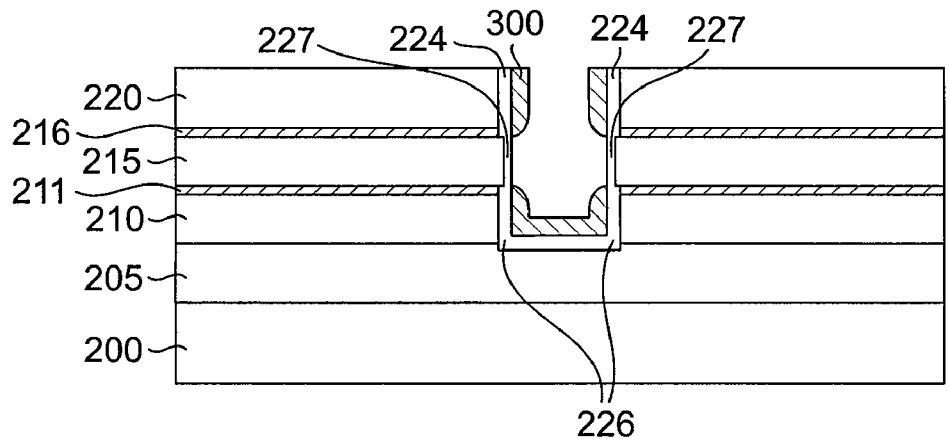
Figure 21:
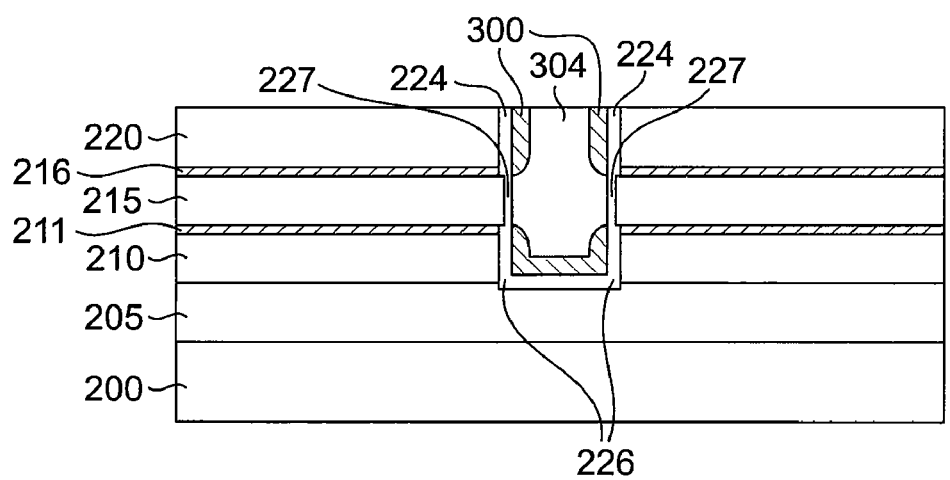

The silicon dioxide layer 300 is then etched, with the result shown in FIG. 20. The thinner portions of the silicon dioxide layer 300 are removed by the etch process. The thicker regions of the silicon dioxide layer 300 are reduced somewhat in thickness, but are still present. Next, a doped polycrystalline silicon layer 304 is deposited within the window 225, contacting the back side of the channel regions 227 in the region where no silicon dioxide is present. If the polycrystalline silicon layer 304 is deposited as an amorphous silicon material and later annealed, it may be necessary to execute a chemical/mechanical polishing step to planarize the top surface of the polycrystalline silicon layer 304 with the top surface of the insulating layer 220. See FIG. 21. Other conductive materials can be used in lieu of the polycrystalline silicon material for the layer 304.

Figure 22:
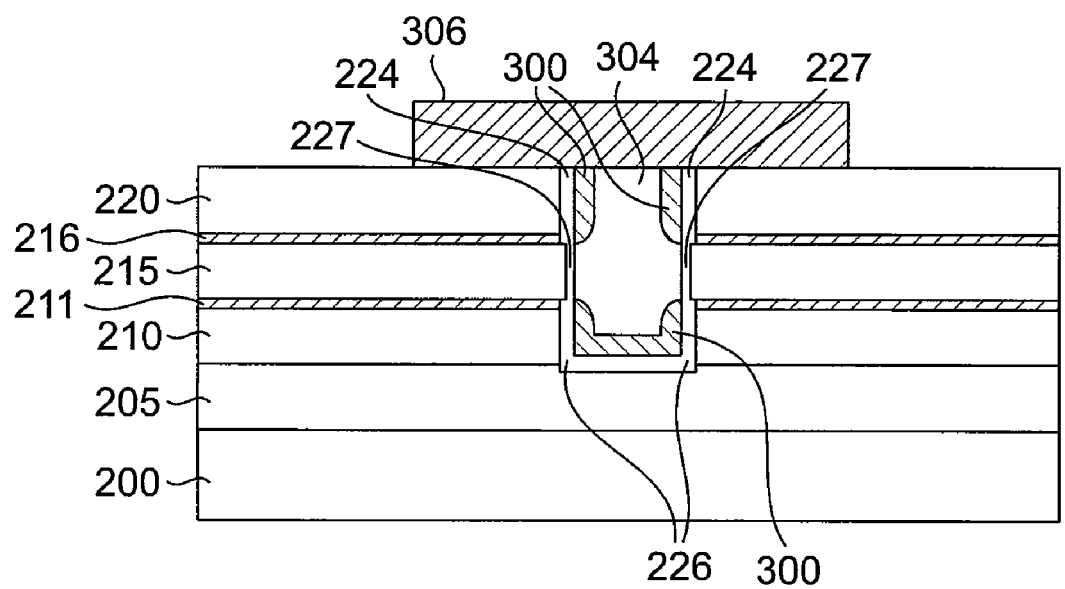
Figure 23:
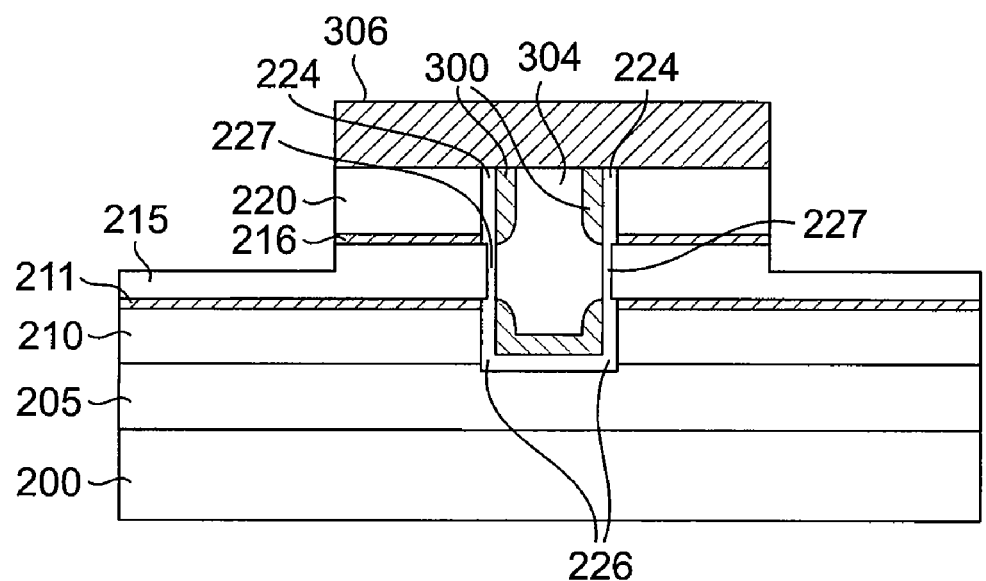
Figure 24:
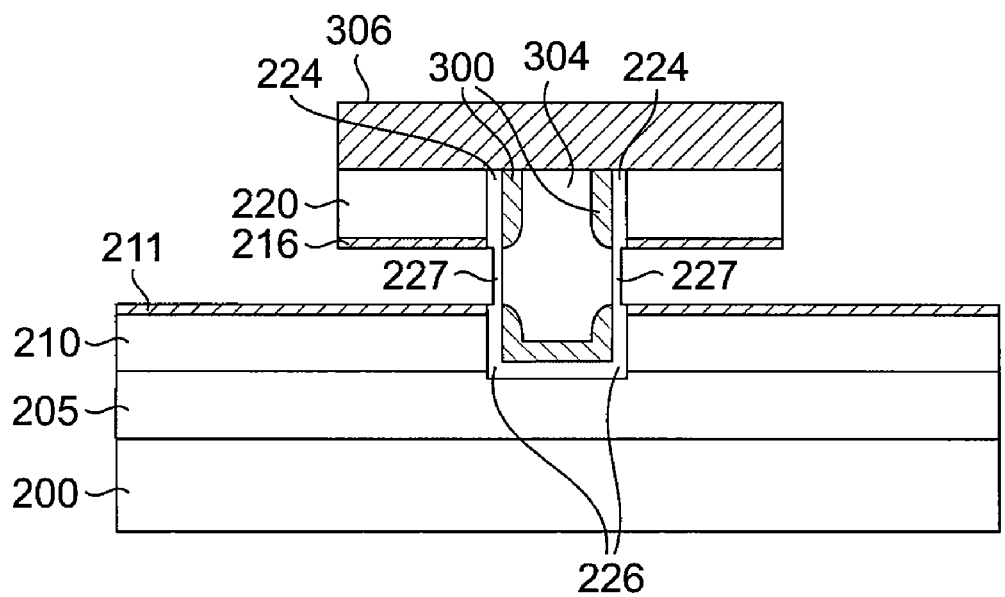

A relatively thick etch stop layer 306 (e.g., silicon nitride) is deposited as shown in FIG. 22. The etch stop layer 306 is then etched using an anisotropic etch, such as a dry plasma etch, which also removes a portion of the insulating layer 220 and the etch stop layer 216. Therefore, as shown in FIG. 23, the sacrificial layer 215 has been exposed. The device is then subjected to a wet etch (e.g., an aqueous hydrofluoric acid) or an isotropic dry etch (e.g., an anhydrous hydrofluoric acid), which removes the exposed remaining portion of the sacrificial layer 215. The result is illustrated in FIG. 24.

Figure 25:
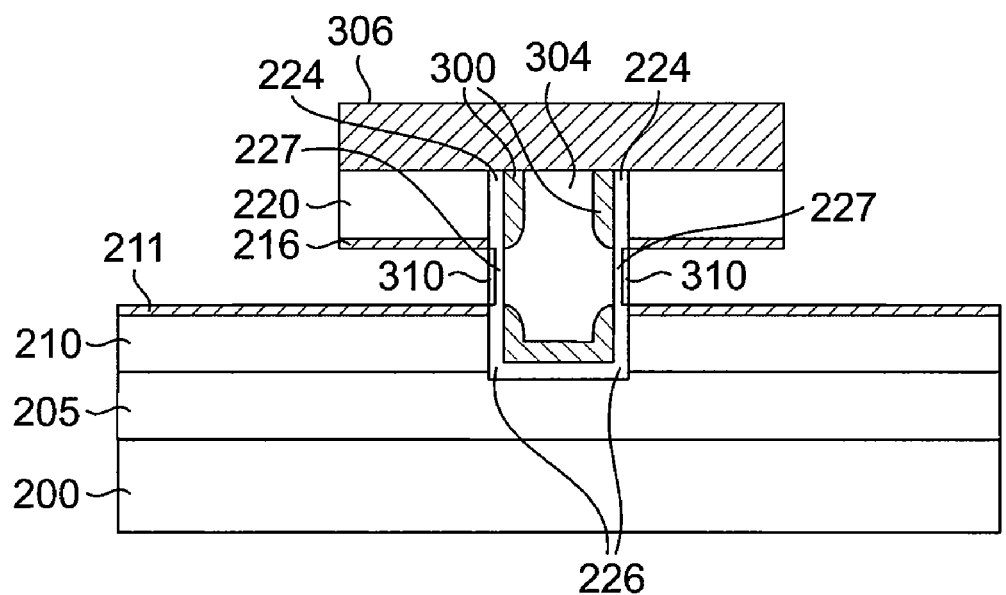

As described above in conjunction with FIGS. 15 and 16, a sacrificial layer of thermal silicon dioxide can be grown on the exposed surface of the channel region 227 and then removed. This process may be beneficial for removing sidewall defects from the channel region 227. Next, a layer of gate dielectric 310 is formed on the channel region 227. The process is similar to that employed in conjunction with FIG. 17 above. The result is illustrated in FIG. 25.

In the SOI MOSFET region, a gate electrode is formed surrounding the gate dielectric 310, by depositing a layer 312 of sufficiently conformal and suitable gate material. For example, a layer of doped amorphous silicon, in which the dopant is introduced in situ, is deposited and then crystallized to form doped polycrystalline silicon.

Figure 26:
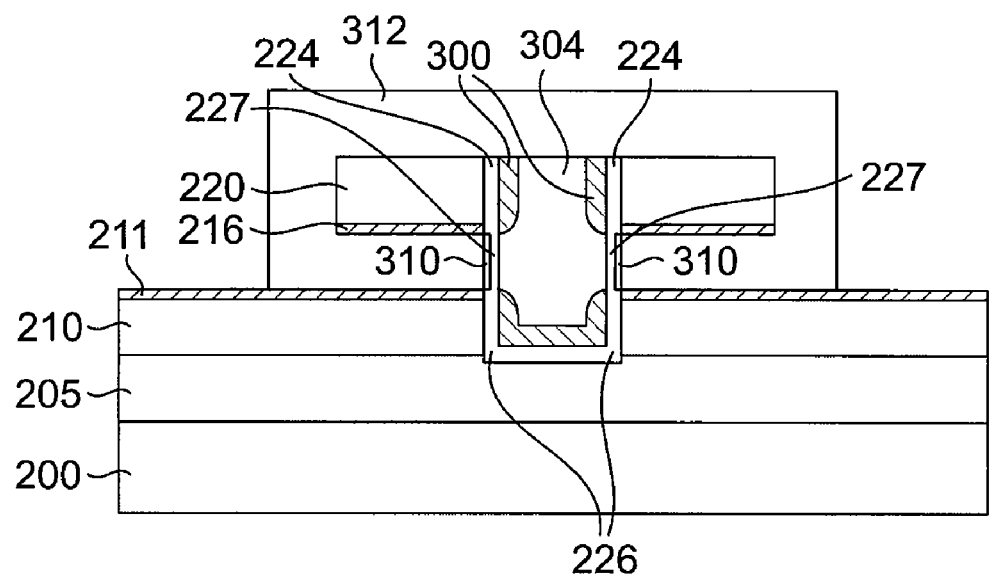
Figure 27:
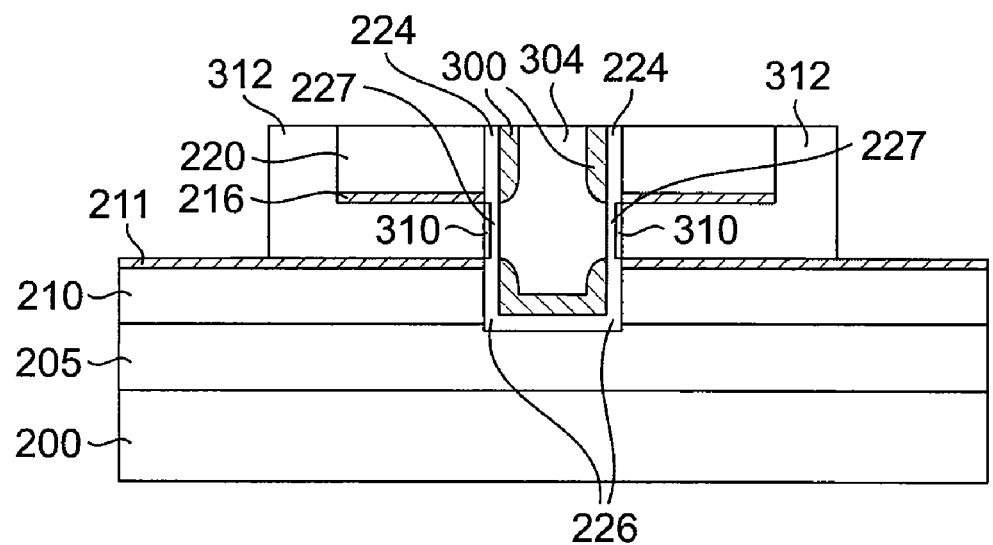
Figure 28:
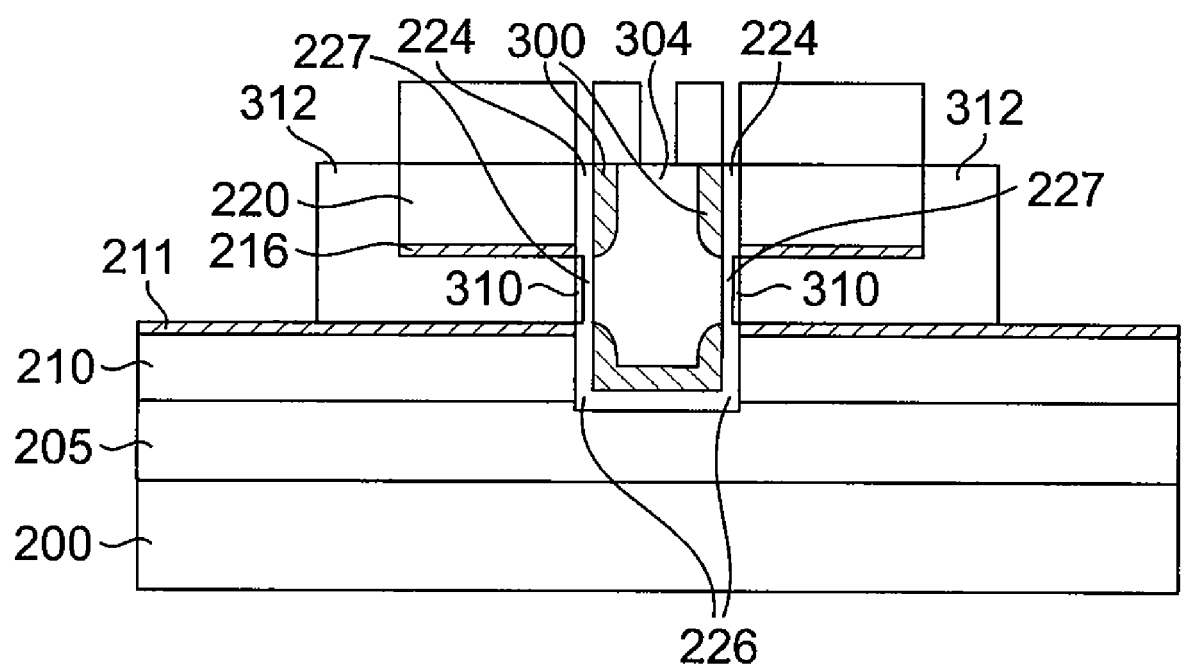

Other examples of suitable gate material are discussed above in conjunction with FIG. 17. The gate electrode layer 312 is illustrated in FIG. 26. The gate electrode is patterned by conventional masking and etching steps with an exemplary final gate electrode 312 illustrated in FIG. 27. Next, a dielectric layer 316 is deposited and etched so that contact can be made to the polysilicon layer 304 and the source regions 224. Additional metalization layers are applied, as is well known in the art, for contacting the gate electrode 312, the source regions 224 and the polysilicon region 304, which in turn contacts the back side of the channel region 227. As a result, the channel region back side can be grounded by grounding the polycrystalline silicon layer 304. This is similar to the grounding of the substrate, in which the channel is formed, in a conventional lateral MOSFET, where this contact is typically referred to as the body contact). But, in this case, unlike a planar SOI MOSFET and other vertical MOSFETs (including a VRG MOSFET) there is no area penalty imposed because the contact to the back side of the channel is made in the same surface as the source and channel contacts. Further, it is known that in most lateral SOI MOSFET devices the channel region is not grounded due to the insulator layer disposed adjacent the channel region.

An architecture and process have been described that is useful for forming SOI MOSFETs in a circuit structure. While specific applications of the invention have been illustrated, the principals disclosed herein provide a basis for practicing the invention in a variety of ways and a variety of circuit structures, including structures formed with Group III-IV compounds and other semiconductor materials. Although the exemplary embodiments pertain to vertical replacement gate SOI MOSFETs, numerous variations are contemplated and applicable to other transistors types. Still other constructions not expressly identified herein do not depart from the scope of the invention, which is limited only by the claims that follow.

What is claimed is:

1. A process for fabricating a vertical silicon-on-insulator MOSFET comprising:

forming a first contact region selected from the group consisting of a source contact region and a drain contact region of a semiconductor device in a semiconductor substrate;

forming a multilayer stack comprising at least three layers of material over the first contact region, wherein the second layer is interposed between the first and the third layers, and wherein the first layer is proximate the first contact region;

forming a window in the at least three layers of material, wherein the window does not extend into the first contact region;

forming a semiconductor material along at least one vertical wall region of the window, wherein the semiconductor material comprises a first, a second and a third doped region, and wherein the first doped region is adjacent the first layer and is doped a first conductivity type and further is in electrical contact with the first contact region, and wherein the second doped region is adjacent the second layer and is doped a second conductivity type, and wherein the third doped region is adjacent the third layer and is doped the first conductivity type;

forming a first insulating surface adjacent the first doped region and extending toward the center of the window;

forming a second insulating surface adjacent the third doped region and extending toward the center of the window;

forming a conductive plug in the remaining open volume of the window, wherein a portion of the plug is in electrical contact with the second doped region on the surface of the second doped region facing the center of the window;

removing the second layer, thereby exposing at least a portion of the second doped region;

forming a gate dielectric layer in contact with the second doped region; and forming a gate in contact with the gate dielectric layer.

2. The process of claim 1 wherein the second layer is removed by etching in an etchant, characterized by a first layer etch rate, a second layer etch rate, and a third layer etch rate, wherein the second layer etch rate is at least ten times faster than one of the first layer etch rate and the third layer etch rate.

3. The process of claim 1 wherein the material of the first, second and the third layer comprises doped insulating material, and wherein the process further comprises doping at least one of the first and the third doped regions by diffusing dopant from the first layer into the third doped region and by diffusing dopant from the third layer into the third doped region.

4. The process of claim 1 wherein the semiconductor material is doped in situ and wherein the material of at least one of the first layer and the third layer comprises doped insulating material, and wherein the process further comprises counterdoping the first doped region with dopant from the first layer and counterdoping the third doped region with dopant from the third layer.

5. The process of claim 4 wherein the step of forming the semiconductor material further comprises:

forming polycrystalline silicon along substantially the entire vertical distance of at least one vertical region of the interior surface of the window; and melting the polycrystalline silicon to form single-crystalline silicon, and wherein the material of the first and the third layers is doped insulating material, and wherein during the step of melting, the dopants in the first layer are driven into the adjacent region of the semiconductor material to form the first doped region and dopants in the third layer are driven into the adjacent region of the semiconductor material to form the third doped region.

* * * * *